United States Patent
Nakaoka

(10) Patent No.: US 11,417,413 B2
(45) Date of Patent: Aug. 16, 2022

(54) SEMICONDUCTOR MEMORY APPARATUS AND METHOD FOR READING THE SAME

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 92 days.

(21) Appl. No.: 16/920,371

(22) Filed: Jul. 2, 2020

(65) Prior Publication Data
US 2021/0005276 A1  Jan. 7, 2021

(30) Foreign Application Priority Data
Jul. 5, 2019  (JP) .............................. JP2019-125946

(51) Int. Cl.
*G11C 29/52* (2006.01)
*G11C 29/44* (2006.01)
(Continued)

(52) U.S. Cl.
CPC .............. *G11C 29/52* (2013.01); *G11C 7/065* (2013.01); *G11C 7/1045* (2013.01);
(Continued)

(58) Field of Classification Search
CPC ......... G11C 29/44; G11C 29/52; G11C 7/065; G11C 7/1045; G11C 7/1048; G11C 29/42;
(Continued)

(56) References Cited

U.S. PATENT DOCUMENTS

| | | | |
|---|---|---|---|
| 4,183,096 A * | 1/1980 | Cenker | G11C 29/44 714/57 |
| 6,550,023 B1 * | 4/2003 | Brauch | G11C 29/40 714/42 |

(Continued)

FOREIGN PATENT DOCUMENTS

| | | |
|---|---|---|
| CN | 103593252 | 2/2014 |
| JP | H0652065 | 2/1994 |

(Continued)

OTHER PUBLICATIONS

"Office Action of Japan Counterpart Application", dated Sep. 15, 2020, p. 1-p. 10.

*Primary Examiner* — Steve N Nguyen
(74) *Attorney, Agent, or Firm* — JCIPRNET

(57) ABSTRACT

A semiconductor memory apparatus including a data memory array, a parity memory array, a data read/write and correction part, a parity read/write part and a syndrome generating and decoding part is provided. The data read/write and correction part reads the data memory array and outputs a first application reading data. The parity read/write part reads the parity memory array and outputs a parity reading data. During a read cycle of an application data, the syndrome generating and decoding part generates a syndrome writing data according to the first application reading data, compares and decodes the syndrome writing data with the parity reading data to generate a verifying comparison data. In the same read cycle, the data read/write and correction part corrects the application data according to the verifying comparison data, and writes the corrected application data back to the data memory array and outputs a corresponding output data.

17 Claims, 8 Drawing Sheets

(51) Int. Cl.
  *G11C 29/42* (2006.01)
  *H03M 13/11* (2006.01)
  *G11C 7/10* (2006.01)
  *G11C 7/06* (2006.01)

(52) U.S. Cl.
  CPC ............ *G11C 7/1048* (2013.01); *G11C 29/42* (2013.01); *G11C 29/44* (2013.01); *H03M 13/1128* (2013.01)

(58) Field of Classification Search
  CPC ....... G11C 11/4096; G11C 2029/0411; H03M 13/1128
  See application file for complete search history.

(56) References Cited

U.S. PATENT DOCUMENTS

| | | | | |
|---|---|---|---|---|
| 6,597,595 | B1* | 7/2003 | Ichiriu | G11C 15/00 365/189.07 |
| 7,051,264 | B2 | 5/2006 | Leung et al. | |
| 7,257,763 | B1* | 8/2007 | Srinivasan | G06F 11/1064 714/718 |
| 7,304,875 | B1* | 12/2007 | Lien | G06F 11/1064 365/200 |
| 8,161,356 | B2* | 4/2012 | Bains | G11C 7/1045 714/766 |
| 2018/0314595 | A1* | 11/2018 | Eichmeyer | G11C 29/52 |

FOREIGN PATENT DOCUMENTS

| | | |
|---|---|---|
| JP | H0773114 | 3/1995 |
| JP | H1125005 | 1/1999 |
| JP | 2003059290 | 2/2003 |
| JP | 2007149222 | 6/2007 |
| JP | 2015122132 | 7/2015 |
| JP | 2016143068 | 8/2016 |
| KR | 20140126225 | 10/2014 |
| KR | 101873526 | 7/2018 |
| TW | 201810290 | 3/2018 |

* cited by examiner

SEMICONDUCTOR MEMORY APPARATUS AND METHOD FOR READING THE SAME

CROSS-REFERENCE TO RELATED APPLICATION

This application claims the priority benefit of Japan application serial no. 2019-125946, filed on Jul. 5, 2019. The entirety of the above-mentioned patent application is hereby incorporated by reference herein and made a part of this specification.

BACKGROUND

Technical Field

The present disclosure relates to a memory apparatus and a method for reading the memory apparatus, and more particularly to a semiconductor memory apparatus capable of performing error checking and correcting operation and a method for reading the semiconductor memory apparatus.

Description of Related Art

Dynamic Random Access Memory (DRAM) has the advantages of simple structure, high unit volume capacity and low cost, and can be applied to various electronic apparatuses. The reliability of data is an important issue in the process of data transmission and/or data storage. Typically, current DRAM often adopts Error Checking and Correcting (ECC) technology to improve data reliability. The data to be written to the DRAM will be subjected to ECC encoding process first to generate the corresponding ECC code, and the data and ECC code are stored altogether. When the data is read, the read data and the ECC code can be compared and decoded to correct the error bit in the data and output the corrected bit.

In order to meet the needs of chip miniaturization, general DRAM adopts Single Error Correcting technology. This technique can only correct one error bit in one data unit, but cannot correct two error bits or more. However, when data is stored in DRAM, error bits may be randomly and intermittently generated due to soft errors caused by high temperature, refresh operation, etc. If there is an error bit in a data unit and the corrected data is not immediately written back to the memory, once more than two error bits are accumulated, the ECC function will fail, and data reliability will be reduced.

SUMMARY

The present disclosure provides a semiconductor memory apparatus capable of performing error correction on intermittently generated error bits during a data read cycle. Besides, the present disclose also provides a method for reading the semiconductor memory apparatus.

A semiconductor memory apparatus of the present disclosure includes a data memory array, a parity memory array, a data read/write and correction part, a parity read/write part and a syndrome generating and decoding part. The data memory array is configured to store an application data. The parity memory array is configured to store a parity data corresponding to the application data. The data read/write and correction part is coupled to the data memory array and configured to read the application data on the data memory array and output a corresponding first application reading data. The parity read/write part is coupled to the parity memory array and configured to read the parity data on the parity memory array and output a corresponding parity reading data. The syndrome generating and decoding part is coupled to the data read/write and correction part and the parity read/write part. During a read cycle of the application data, the syndrome generating and decoding part generates the syndrome writing data according to the first application reading data, and compares and decodes the syndrome writing data with the parity reading data to generate a verifying comparison data. In the same read cycle, the data read/write and correction part corrects the application data according to the verifying comparison data, and writes the corrected application data back to the data memory array and outputs a corresponding output data.

A method for reading a semiconductor memory apparatus including a data memory array and a parity memory array of the present disclosure includes storing an application data in the data memory array; storing a parity data corresponding to the application data in the parity memory array; reading the application data, and outputting a corresponding first application reading data according to the read application data; reading the parity data, and outputting a corresponding parity reading data according to the read parity data; in a read cycle of the application data, generating a syndrome writing data according to the first application reading data, and generating a verifying comparison data by comparing and decoding the syndrome writing data and the parity reading data, and in the same read cycle of the application data, correcting the application data according to the verifying comparison data, and writing the corrected application data back to the data memory array and outputting a corresponding output data.

Based on the above, when error bit occurs in one bit in the data read cycle, the semiconductor memory apparatus and the method for reading the semiconductor memory apparatus of the present disclosure can detect the position of the error bit in the same read cycle and perform correction immediately, and write the corrected data back to the memory array. In this way, it is possible to avoid the accumulation of error bit in two bits or more, thereby improving the reliability of the data.

In order to make the aforementioned features and advantages of the disclosure more comprehensible, embodiments accompanying figures are described in detail below.

DESCRIPTION OF THE EMBODIMENTS

Figure 1:
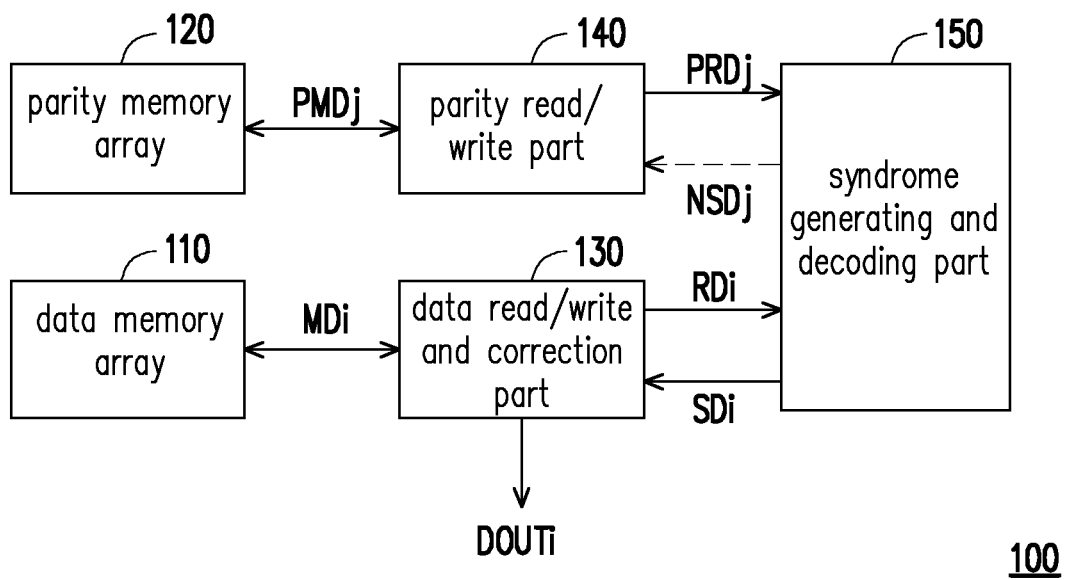
FIG. 1 is a schematic circuit diagram of a semiconductor memory apparatus according to an embodiment of the disclosure.

Please refer to FIG. 1. FIG. 1 is a schematic circuit diagram of a semiconductor memory apparatus according to an embodiment of the disclosure. A semiconductor memory apparatus 100 includes a data memory array 110, a parity memory array 120, a data read/write and correction part 130, a parity read/write part 140, and a syndrome generating and decoding part 150. The semiconductor memory apparatus 100 may be a DRAM. The data memory array 110 is configured to store the application data MDi. The application data MDi has i+1 bits. The parity memory array 120 is configured to store the parity data PMDj corresponding to the application data MDi. The parity data PMDj is, for example, an Error Checking and Correcting (ECC) code generated by subjecting the application data MDi to an ECC encoding process such as Hamming code. The parity data PMDj has j+1 bits, which depends on the number of bits (i.e., i+1) of the application data MDi to be subjected to the ECC operation. For example, the single error correcting technology adopted in the embodiment of the present disclosure can perform a single error correction on the application data MD0~MD63 of 64 bits according to the parity data PMD0~PMD6 of 7 bits. In other embodiments, the single error correction may be performed on the application data of 128 bits according to the parity data of 8 bits, and those skilled in the art may make the same inference depending on actual needs.

The data read/write and correction part 130 is coupled to the data memory array 110, and configured to sense and amplify the application data MDi of the data memory array 110, and output the corresponding first application reading data RDi to the syndrome generating and decoding part 150. The parity read/write part 140 is coupled to the parity memory array 120, and configured to sense and amplify the parity data PMDj of the parity memory array 120, and output the corresponding parity reading data PRDj to the syndrome generating and decoding part 150. In this embodiment, i and j may be integers, where 0≤i≤63, and 0≤j≤6, but the disclosure is not limited thereto.

The syndrome generating and decoding part 150 is coupled to the data read/write and correction part 130 and the parity read/write part 140. In the embodiment of the present disclosure, during the read cycle of one application data MDi, the syndrome generating and decoding part 150 may perform syndrome encoding on the first application reading data RDi and generate the syndrome writing data NSDj. Then, the syndrome writing data NSDj and the parity reading data PRDj are compared and subjected to syndrome decoding to generate the verifying comparison data SDi. The verifying comparison data SDi is configured to indicate whether the application data MDi needs to be corrected.

Moreover, in the same read cycle, the data read/write and correction part 130 can receive the verifying comparison data SDi and correct the application data MDi according to the verifying comparison data SDi, and the corrected application data MDi is written back to the data memory array 110 and outputted as the corresponding output data DOUTi. In this manner, when the application data MDi generates an error bit, the semiconductor memory apparatus 100 can complete the output of the output data DOUTi and write the corrected application data MDi back to the data memory array 110 in the same read cycle, so as to prevent the error bits from remaining to the next read cycle, thereby improving reliability of data.

Furthermore, the syndrome generating and decoding part 150 may also transmit the syndrome writing data NSDj to the parity read/write part 140 to be written to the parity memory array 120 as the corresponding parity data PMDj, thereby updating the parity data PMDj (that is, the ECC code).

Figure 2A:
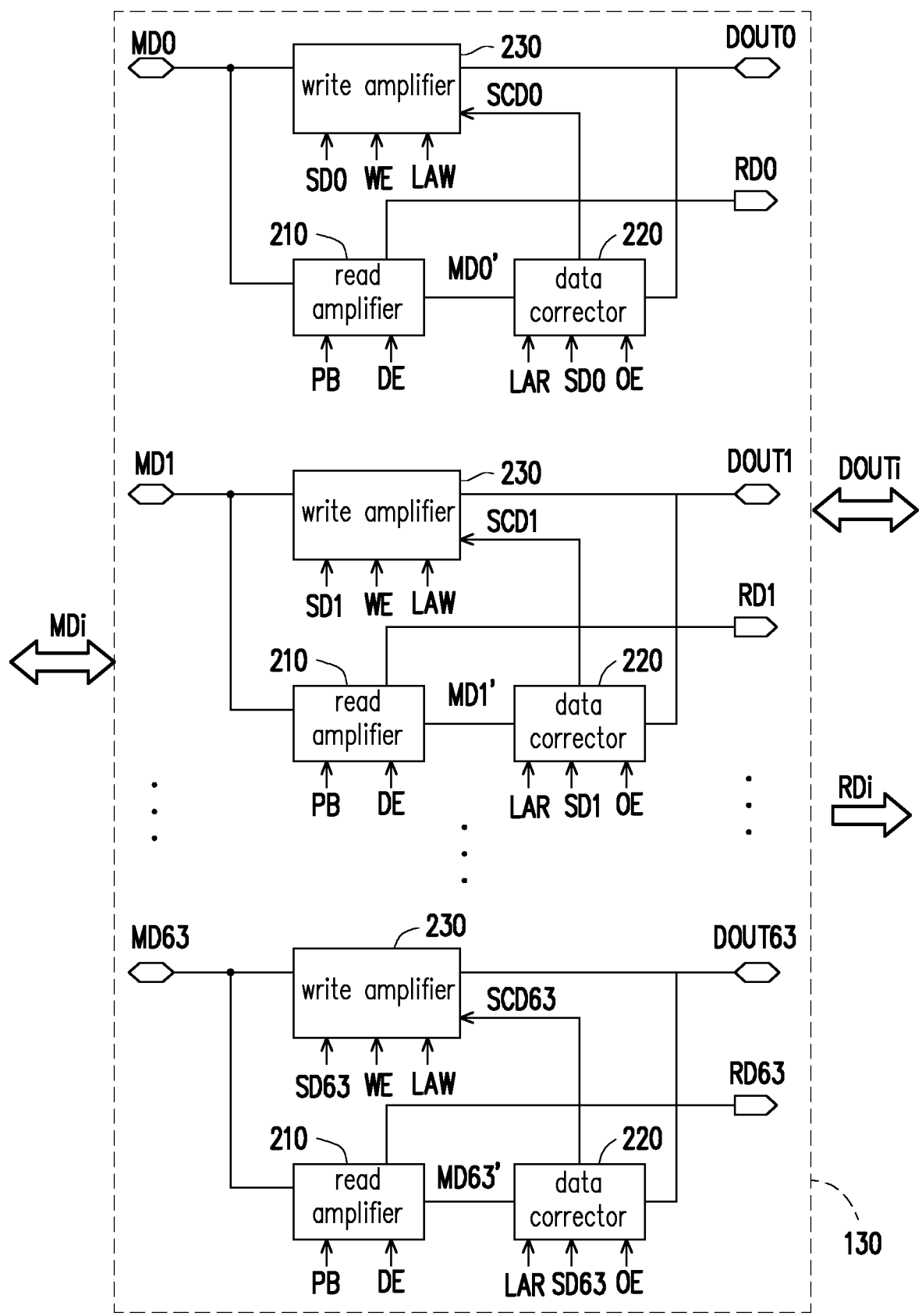
FIG. 2A is a schematic circuit diagram of a data read/write and correction part according to an embodiment of the present disclosure.

The following is a detailed description of the detailed structure in the data read/write and correction part of the case. FIG. 2A is a schematic circuit diagram of a data read/write and correction part according to an embodiment of the present disclosure. As shown in FIG. 2A, the data read/write and correction part 130 includes a plurality of read amplifiers 210, a plurality of data correctors 220, and a plurality of write amplifiers 230. Each of the read amplifiers 210 reads and amplifies the application data MDi from the data memory array 110 to generate corresponding first application reading data RDi and second application reading data MDi'.

Each of the data correctors 220 is coupled to the corresponding read amplifier 210. The data corrector 220 may latch the second application reading data MDi' and correct the second application reading data MDi' according to the received verifying comparison data SDi to generate the correct output data DOUTi, and output the corresponding correction data SCDi to the write amplifier 230.

Each of the write amplifiers 230 is coupled to the corresponding error corrector 220. The plurality of write amplifiers 230 can write the corrected application data MDi (i.e., equivalent to the output data DOUTi) back to the data memory array 110 according to the correction data SCDi and the verifying comparison data SDi.

In addition, the precharging signal PB, the read amplifier enabling signal DE, the read data latching signal LAR, the output enabling signal OE and the write amplifier enabling signal WE inputted to the read amplifier 210, the data corrector 220 and the write amplifier 230 serve as the control signals for a read operation; the write amplifier enabling signal WE and the write data latching signal LAW serve as control signals for a write operation. The control signals may be provided, for example, by a central processing part (CPU) or other logic circuits constituted by multiple logic gates, but the disclosure is not limited thereto.

Figure 2B:
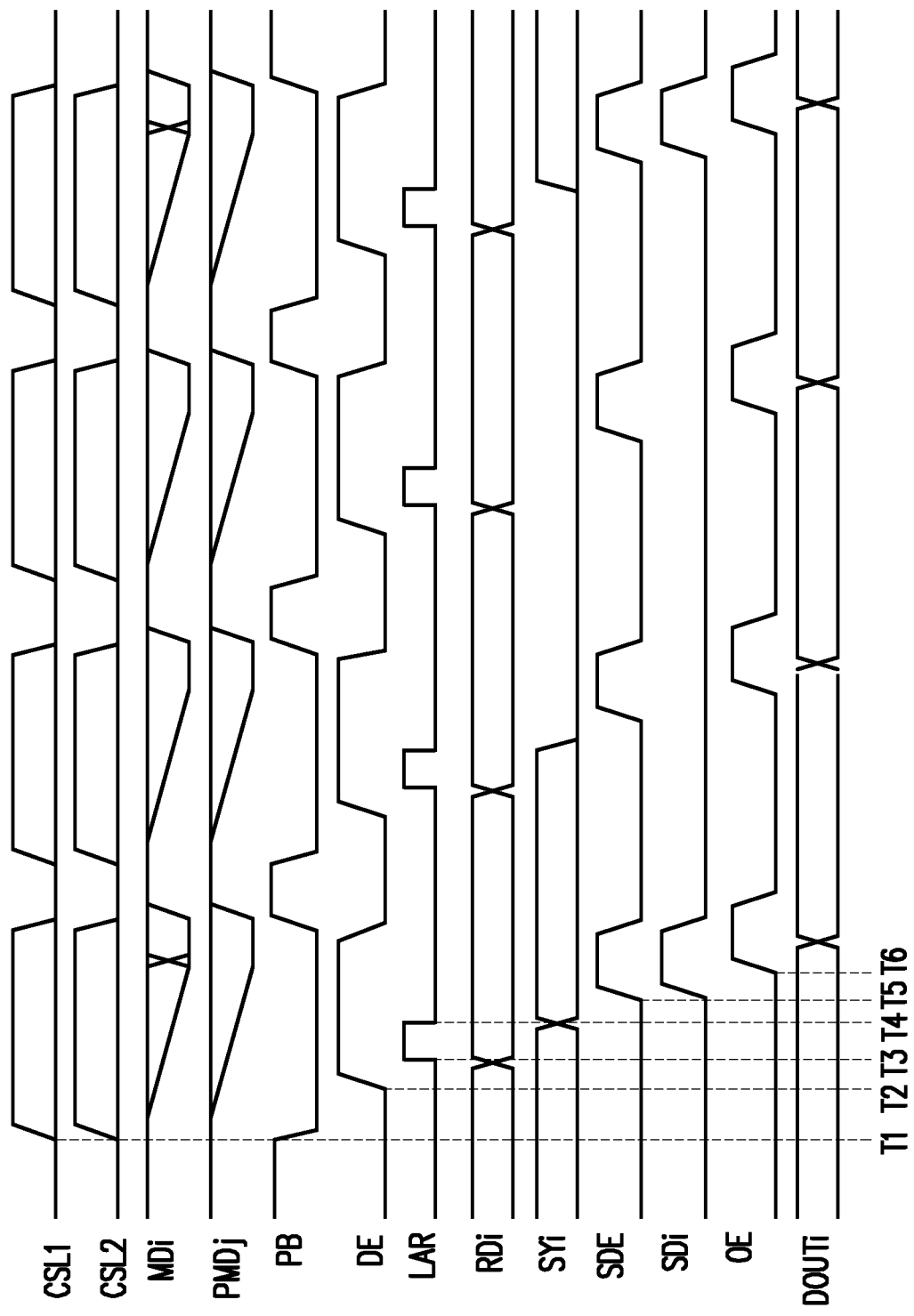
FIG. 2B is a schematic timing waveform diagram showing a read operation of a semiconductor memory apparatus according to an embodiment of the present disclosure.

FIG. 2B is a schematic timing waveform diagram showing a read operation of a semiconductor memory apparatus according to an embodiment of the present disclosure. Referring to FIG. 1, FIG. 2A and FIG. 2B, the following descriptions are dedicated to how the semiconductor memory apparatus 100 of the present disclosure completes the correction and read operation during one read cycle (i.e., a period in which the selection signals CSL1 and CSL2 are maintained at high logic level). As shown in FIG. 2B, when the read operation is to be started (i.e., time point T1), the precharging signal PB transmitted to the read amplifier 210 is changed from high logic level to low logic level to finish the precharging operation. In the meantime, the selection signal CSL1 for selecting the data memory array 110 and the selection signal CSL2 for selecting the parity memory array 120 are changed from low logic level to high logic level to read the selected memory cell, thereby outputting the corresponding application data MDi and parity data PMDj. The application data MDi includes a positive application data MDiT and a negative application data MDiN. The parity data PMDj includes a positive parity data PMDjT and a negative parity data PMDjN.

Then, at time point T2, the read amplifier enabling signal DE transmitted to the read amplifier 210 is changed from low logic level to high logic level, such that each of the read amplifiers 210 begins outputting the second application reading data MDi' and generating the corresponding first application reading data RDi.

After that, as shown in FIG. 2B, the logic level of the read data latching signal LAR transmitted to each of the data correctors 220 will be changed from low to high (such as time point T3), and then changed from high to low (e.g., time point T4), such that each of the data correctors 220 latches the second application read data MDi', and generates corresponding positive latch bit signal EiT and negative latch bit signal EiN.

On the other hand, in the same read cycle of the application data MDi, the syndrome generating and decoding part 150 that receives the first application reading data RDi can perform the syndrome operation by using the first reading data RDi to generate a syndrome writing data NSDj. The syndrome operation can be implemented, for example, according to a lookup table, and its implementation and operation can be implemented by prior art. Moreover, the syndrome generating and decoding part 150 can compare the syndrome writing data NSDj with the parity reading data PRDj, for example, perform an exclusive-OR (XOR) operation to generate a bit error signal SYj (e.g., time point T4).

When an error bit occurs in the read application data MDi, part of the bit error signal SYj corresponding to the position of the error bit is changed from low logic level to high logic level. As shown in FIG. 2B, when the logic level of the verifying comparison enabling signal SDE received by the syndrome generating and decoding part 150 is changed from low logic level to high logic level (e.g., time point T5), the syndrome generating and decoding part 150 can decode the bit error signal SYj to obtain the position of the error bit, and change one verifying comparison data SDi corresponding to the error position from the low logic level to the high logic level.

Therefore, in the read cycle of the same application data MDi, the data corrector 220 that latches the error bit receives the verifying comparison data SDi that is changed to the high logic level, thereby inverting the value of the error bit to generate the inverted positive latch bit signal EiT and the inverted negative latch bit signal EiN.

After that, the output enabling signal OE transmitted to each of the data correctors 220 is changed from low logic level to high logic level (e.g., time point T6). Each of the data correctors 220 may generate the output data DOUTi and the correction data SCDi according to the output enabling signal OE and the corresponding positive latch bit signal EiT as well as the negative latch bit signal EiN. In this manner, during the read cycle, the data read/write and correction part 130 can output the corrected output data DOUTi, and transmit the correction data SCDi to the corresponding write amplifier 230.

During the read cycle of the same application data MDi, each of the write amplifiers 230 can write the corrected application data MDi into the data memory array 110 according to the received correction data SCDi and the verifying comparison data SDi. Specifically, the write data latching signal LAW will remain at low logic level during the read cycle. When the write amplifier enabling signal WE is changed from low logic level to high logic level, the write amplifier 230 can generate the corrected application data MDi according to the correction data SCDi and the verifying comparison data SDi that is changed from the low logic level to the high logic level, and write the corrected application data MDi into the memory cell where the error bit occurs.

In the meantime, if there is no error bit in the read application data MDi, all the verifying comparison data SDi will remain at low logic level, and the data read/write and correction part 130 will not correct all the read application data MDi, and directly output the read application data MDi as the output data DOUTi.

Based on the above read operation, the semiconductor memory apparatus 100 of the embodiment of the present disclosure can detect the position of the intermittently and randomly generated error bits during the same read cycle (i.e., during which the selection signals CSL1, CSL2 are maintained at high logic level) and make correction immediately to ensure the accuracy of data in the next read operation.

Figure 3:
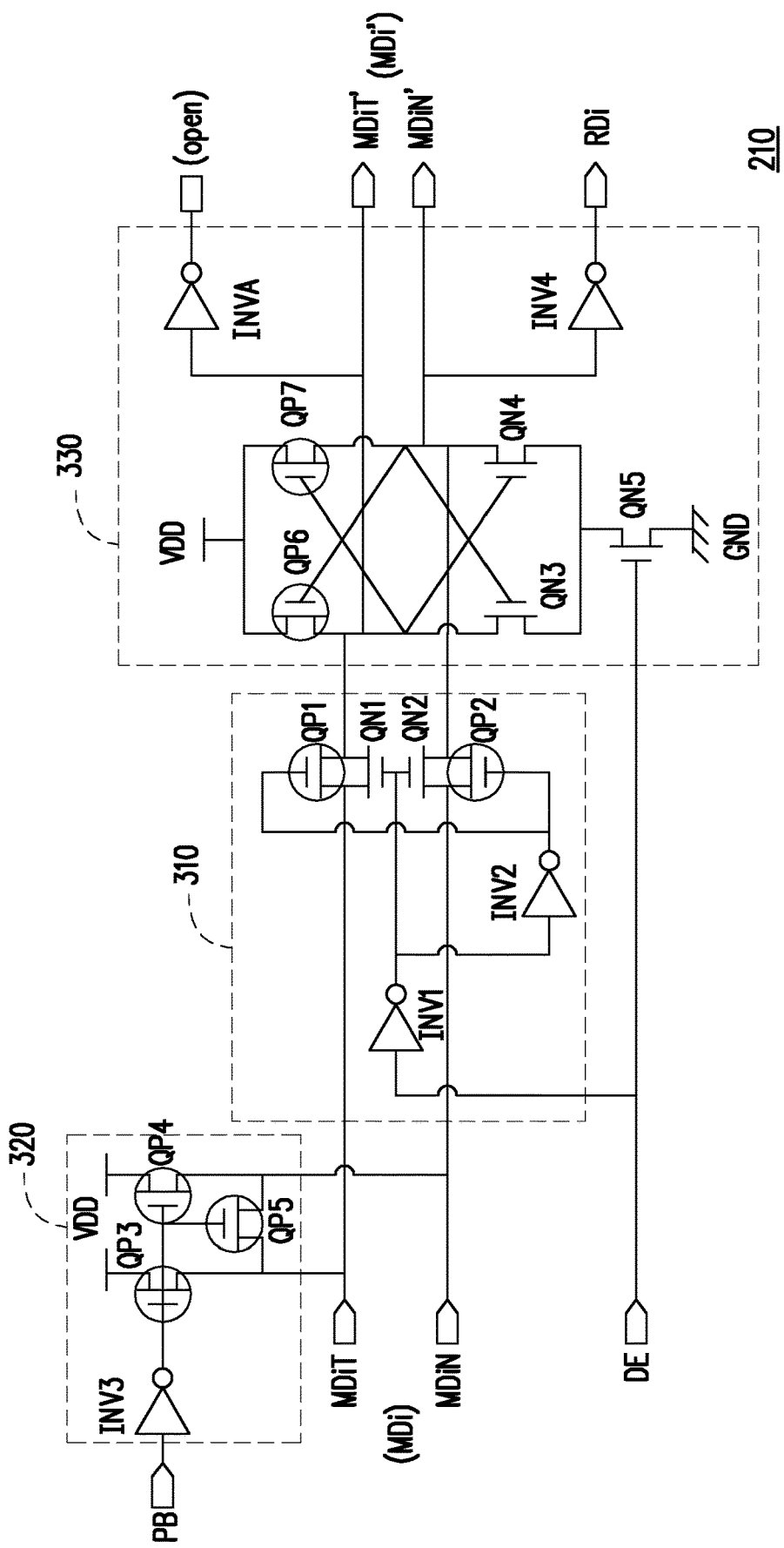
FIG. 3 is a schematic circuit diagram of a read amplifier according to an embodiment of the present disclosure.

FIG. 3 is a schematic circuit diagram of a read amplifier according to an embodiment of the present disclosure. Each of the read amplifiers 210 includes a first switch 310, a precharging circuit 320, and an amplification circuit 330. Referring to FIG. 2B and FIG. 3 together, in the read operation of the application data MDi, the precharging circuit 320 may first terminate the precharging action according to the precharging signal PB at the low logic level. Then, the first switch 310 can be turned on according to the read amplifier enabling signal DE at the high logic level, such that the amplification circuit 330 amplifies the potential difference between the positive application data MDiT and the negative application data MDiN to output the second application reading data MDi' (including the positive second application reading data MDiT' and the negative second application reading data MDiN') and the corresponding first application reading data RDi.

The first terminal of the first switch 310 is coupled to the corresponding positive application data MDiT and the negative application data MDiN, and the control terminal of the first switch 310 is coupled to the read amplifier enabling signal DE. The first switch 310 includes, for example, a first N-type field-effect transistor (FET) QN1, a first P-type FET QP1, a second N-type FET QN2, a second P-type FET QP2, a first inverter INV1 and a second inverter INV2. The drain of the first N-type FET QN1 is coupled to the positive application data MDiT. The source of the first P-type FET QP1 is coupled to the drain of the first N-type FET QN1, the drain of the first P-type FET QP1 is coupled to the source of the first N-type FET QN1. The drain of the second N-type FET QN2 is coupled to the negative application data MDiN. The source of the second P-type FET QP2 is coupled to the drain of the second N-type FET QN2, and the drain of the second P-type FET QP2 is coupled to the source of the second N-type FET QN2. The input terminal of the first inverter INV1 is coupled to the read amplifier enabling signal DE, and the output terminal of the first inverter INV1 is coupled to the gate of the first N-type FET QN1 and the gate of the second N-type FET QN2. The input terminal of the second inverter INV2 is coupled to the output terminal of the first inverter INV1, and the output terminal of the second inverter INV2 is coupled to the gate of the first P-type FET QP1 and the gate of the second P-type FET QP2. With the above structure, the first switch 310 can be turned on or off according to the read amplifier enabling signal DE.

The precharging circuit 320 is coupled to the first terminal of the first switch 310 and receives the precharging signal PB. The precharging circuit 320 includes, for example, a third inverter INV3, a third P-type FET QP3, a fourth P-type FET QP4, and a fifth P-type FET QP5. The input terminal of the third inverter INV3 is coupled to the precharging signal PB. The source of the third P-type FET QP3 is coupled to the operation voltage VDD, the gate of the third P-type FET QP3 is coupled to the output terminal of the third inverter INV3, and the drain of the third P-type FET QP3 is coupled to the drain of the first N-type FET QN1. The source of the fourth P-type FET QP4 is coupled to the operation voltage VDD, the gate of the fourth P-type FET QP4 is coupled to the output terminal of the third inverter INV3, and the drain of the fourth P-type FET QP4 is coupled to the drain of the second N-type FET QN2. The source of the fifth P-type FET QP5 is coupled to the drain of the third P-type FET QP3, the gate of the fifth P-type FET QP5 is coupled to the gate of the fourth P-type FET QP4, and the drain of the fifth P-type FET QP5 is coupled to the drain of the fourth P-type FET QP4. With the above structure, the precharging circuit 320 can precharge the first terminal of the first switch 310 according to the precharging signal PB.

The input terminal of the amplification circuit 330 is coupled to the second terminal of the first switch 310, and the control terminal of the amplification circuit 330 is coupled to the read amplifier enabling signal DE. The amplification circuit 330 includes, for example, a sixth P-type FET QP6, a seventh P-type FET QP7, a third N-type FET QN3, a fourth N-type FET QN4, and a fifth N-type FET QN5 and a fourth inverter INV4. The source of the sixth P-type FET QP6 is coupled to the operation voltage VDD, and the drain of the sixth P-type FET QP6 is coupled to the source of the first N-type FET QN1. The source of the seventh P-type FET QP7 is coupled to the operation voltage VDD, and the drain of the seventh P-type FET QP7 is coupled to the source of the second N-type FET QN2. The drain of the third N-type FET QN3 is coupled to the drain of the sixth P-type FET QP6 and the gate of the seventh P-type FET QP7, and outputs the positive second application reading data MDiT', the gate of the third N-type FET QN3 is coupled to the drain of the seventh P-type FET QP7. The drain of the fourth N-type FET QN4 is coupled to the drain of the seventh P-type FET QP7 and the gate of the sixth P-type FET QP6, and outputs the negative second application reading data MDiN', the gate of the fourth N-type FET QN4 is coupled to the drain of the sixth P-type FET QP6. The drain of the fifth N-type FET QN5 is coupled to the source of the third N-type FET QN3 and the source of the fourth N-type FET QN4, and the gate of the fifth N-type FET QN5 is coupled to the read amplifier enabling signal DE, and the source of the fifth N-type FET QN5 is coupled to the ground voltage GND. The input terminal of the fourth inverter INV4 is coupled to the drain of the fourth N-type FET QN4, and the output terminal of the fourth inverter INV4 outputs the first application reading data RDi. With the above structure, the amplification circuit 330 can output the second application reading data MDi' and the corresponding first application reading data RDi according to the read amplifier enabling signal DE. In addition, the output terminal that outputs the positive second application reading data MDiT' may also be coupled to an inverter INVA with an opened output terminal, so that the load of the output terminal of the positive second application reading data MDiT' is consistent with the load of the output terminal of the negative second application reading data MDiN'.

Figure 4:
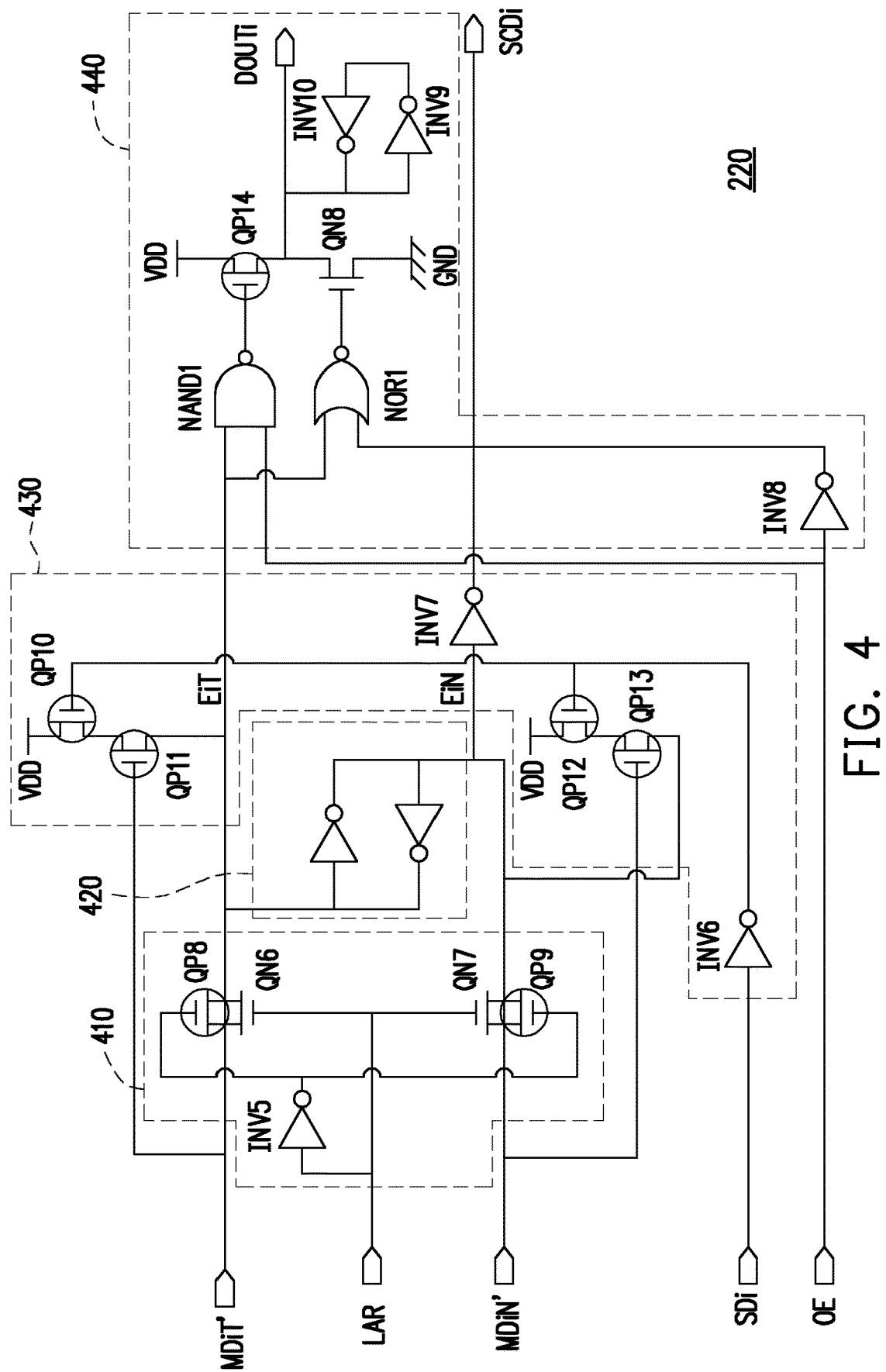
FIG. 4 is a schematic circuit diagram of a data corrector according to an embodiment of the disclosure.

FIG. 4 is a schematic circuit diagram of a data corrector according to an embodiment of the disclosure. Each of the data correctors 220 includes a second switch 410, a first latch circuit 420, a correction circuit 430, and a first output circuit 440. Referring to FIG. 2B and FIG. 4, in the read operation of the application data MDi, the second switch 410 can be turned on according to the read data latching signal LAR at the high logic level. Then, the first latch circuit 420 can latch the second application reading data MDi'. When the read application data MDi has an error bit, the correction circuit 430 of the data corrector 220 corresponding to the error bit can receive the verifying comparison data SDi that indicates error so as to correct the latched second application reading data MDi' in the same read cycle and output the corresponding correction data SCDi. The first output circuit 440 can output the corresponding output data DOUTi according to the output enabling signal OE at the high logic level.

The first terminal of the second switch 410 is coupled to the positive second application reading data MDiT' and the negative second application reading data MDiN', and the control terminal of the second switch 410 is coupled to the read data latching signal LAR. The second switch 410 includes a sixth N-type FET QN6, an eighth P-type FET QP8, a seventh N-type FET QN7, a ninth P-type FET QP9, and a fifth inverter INV5. The drain of the sixth N-type FET QN6 is coupled to the positive second application reading data MDiT', and the gate of the sixth N-type FET QN6 is coupled to the read data latching signal LAR. The source of the eighth P-type FET QP8 is coupled to the drain of the sixth N-type FET QN6, and the drain of the eighth P-type FET QP8 is coupled to the source of the sixth N-type FET QN6. The drain of the seventh N-type FET QN7 is coupled to the negative second application reading data MDiN', and the gate of the seventh N-type FET QN7 is coupled to the read data latching signal LAR. The source of the ninth P-type FET QP9 is coupled to the drain of the seventh N-type FET QN7, and the drain of the ninth P-type FET QP9 is coupled to the source of the seventh N-type FET QN7. The input terminal of the fifth inverter INV5 is coupled to the read data latching signal LAR, and the output terminal of the fifth inverter INV5 is coupled to the gate of the eighth P-type FET QP8 and the gate of the ninth P-type FET QP9. With the above structure, the second switch 410 can be turned on or off according to the read data latching signal LAR.

The first latch circuit 420 is coupled to the second terminal of the second switch 410 for latching the second application reading data MDi', and outputting the positive latch bit signal EiT and the negative latch bit signal EiN to the correction circuit 430. The first latch circuit 420 can be implemented by a known latch circuit. For example, the first latch circuit may include two inverters, wherein an input terminal of one inverter is coupled to an output terminal of the other inverter, and an output terminal of one of the inverters is coupled to an input terminal of the other inverter.

The correction circuit 430 is coupled to the first latch circuit 420 and receives the corresponding verifying comparison data SDi. The correction circuit 430 includes a sixth inverter INV6, a tenth P-type FET QP10, an eleventh P-type FET QP11, a twelfth P-type FET QP12, a thirteenth P-type FET and a seventh inverter INV7. The input terminal of the sixth inverter INV6 is coupled to the verifying comparison data SDi. The source of the tenth P-type FET QP10 is coupled to the operation voltage VDD, and the gate of the tenth P-type FET QP10 is coupled to the output terminal of the sixth inverter INV6. The source of the eleventh P-type FET QP11 is coupled to the drain of the tenth P-type FET QP10, and the gate of the eleventh P-type FET QP11 is coupled to the positive second application reading data MDiT', the drain of the eleventh P-type FET QP11 is coupled to the first latch circuit 420. The source of the twelfth P-type FET QP12 is coupled to the operation voltage VDD, and the gate of the twelfth P-type FET QP12 is coupled to the output terminal of the sixth inverter INV6. The source of the thirteenth P-type FET QP13 is coupled to the drain of the twelfth P-type FET QP12, and the gate of the thirteenth P-type FET QP13 is coupled to the second application reading data MDiN', the drain of the thirteenth P-type FET QP13 is coupled to the first latch circuit 420. The input terminal of the seventh inverter INV7 is coupled to the first latch circuit 420, and the output terminal of the seventh inverter INV7 outputs the correction data SCDi. With the above structure, the correction circuit 430 can correct the second application reading data MDi' latched by the latch circuit 420 according to the verifying comparison data SDi to output the corresponding correction data SCDi.

The first output circuit 440 is coupled to the correction circuit 430 and receives an output enabling signal OE. The first output circuit 440 includes an eighth inverter INV8, a first NAND gate NAND1, a first NOR gate NOR1, a fourteenth P-type FET QP14, an eighth N-type FET QNB, a ninth inverter INV9 and a tenth inverter INV10. The input terminal of the eighth inverter INV8 is coupled to the output enabling signal OE. The first input terminal of the first NAND gate NAND1 is coupled to the drain of the eleventh P-type FET QP11, and the second input terminal of the first NAND gate NAND1 is coupled to the output enabling signal OE. The first input terminal of the first NOR gate NOR1 is coupled to the drain of the eleventh P-type FET QP11, and the second input terminal of the first NOR gate NOR1 is coupled to the output terminal of the eighth inverter INV8. The source of the fourteenth P-type FET QP14 is coupled to the operation voltage VDD, and the gate of the fourteenth P-type FET QP14 is coupled to the output terminal of the first NAND gate NAND1. The drain of the eighth N-type FET QN8 is coupled to the drain of the fourteenth P-type FET QP14 and outputs the corrected output data DOUTi. The gate of the eighth N-type FET QN8 is coupled to the output terminal of the first NOR gate NOR1, and the source of the eighth N-type FET QN8 is coupled to the ground voltage GND. The input terminal of the ninth inverter INV9 is coupled to the drain of the fourteenth P-type FET QP14. The input terminal of the tenth inverter INV10 is coupled to the output terminal of the ninth inverter INV9, and the output terminal of the tenth inverter INV10 is coupled to the input terminal of the ninth inverter INV9. With the above structure, the first output circuit 440 can output the corresponding output data DOUTi according to the output enabling signal OE.

Figure 5:
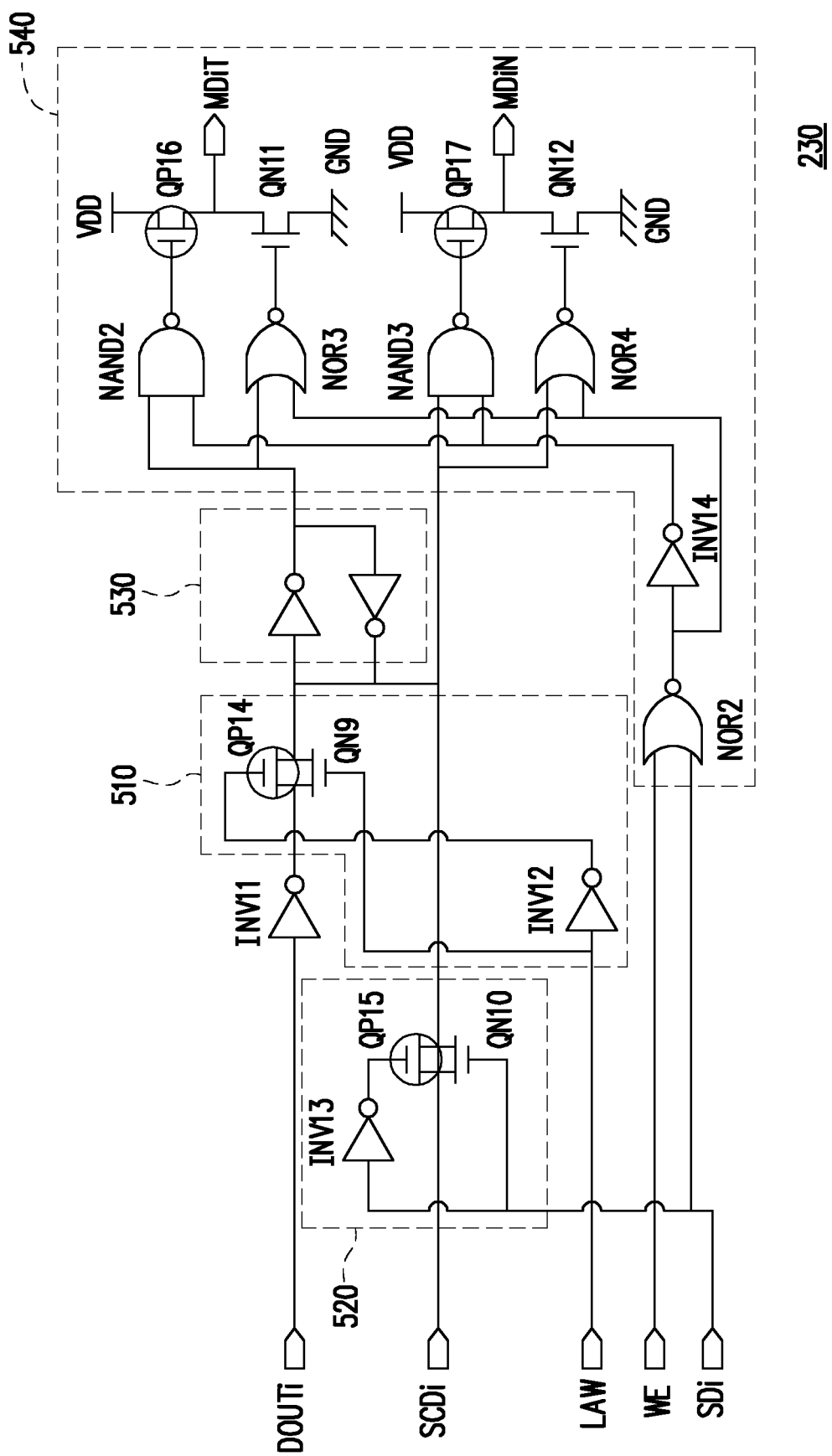
FIG. 5 is a schematic circuit diagram of a write amplifier according to an embodiment of the present disclosure.

FIG. 5 is a schematic circuit diagram of a write amplifier according to an embodiment of the present disclosure. Each of the write amplifiers 230 includes an eleventh inverter INV11, a third switch 510, a fourth switch 520, a second latch circuit 530, and a second output circuit 540. The input terminal of the eleventh inverter INV11 is coupled to the corresponding output data DOUTi. The second latch circuit 530 is coupled to the second terminal of the third switch 510 and the second terminal of the fourth switch 520. The second latch circuit 530 can be implemented by a known latch circuit.

Referring to FIG. 2B and FIG. 5, in the read cycle of the same application data MDi, since the write data latching signal LAW will remain at low logic level, the third switch 510 will be turned off. The fourth switch 520 can read the correction data SCDi according to the verifying comparison data SDi that is changed into the high logic level. In this manner, the second output circuit 540 can output the corrected application data MDi (including the positive application data MDiT and the negative application data MDiN) according to correction data SCDi and the verifying comparison data SDi.

The first terminal of the third switch 510 is coupled to the output terminal of the eleventh inverter INV11, and the control terminal of the third switch 510 is coupled to the write data latching signal LAW. The third switch 510 includes a ninth N-type FET QN9, a fourteenth P-type FET QP14, and a twelfth inverter INV12. The drain of the ninth N-type FET QN9 is coupled to the output terminal of the eleventh inverter INV11, and the gate of the ninth N-type FET QN9 is coupled to the write data latching signal LAW. The source of the fourteenth P-type FET QP14 is coupled to the drain of the ninth N-type FET QN9, and the drain of the fourteenth P-type FET QP14 is coupled to the source of the ninth N-type FET QN9. The input terminal of the twelfth inverter INV12 is coupled to the write data latching signal LAW, and the output terminal of the twelfth inverter INV12 is coupled to the gate of the fourteenth P-type FET QP14. With the above structure, the third switch 510 can be turned on or off according to the write data latching signal LAW.

The first terminal of the fourth switch 520 is coupled to the corresponding correction data SCDi, and the control terminal of the fourth switch 520 is coupled to the corresponding verifying comparison data SDi. The fourth switch 520 includes a tenth N-type FET QN10, a fifteenth P-type FET QP15, and a thirteenth inverter INV13. The drain of the tenth N-type FET QN10 is coupled to the correction data SCDi, and the gate of the tenth N-type FET QN10 is coupled to the verifying comparison data SDi. The source of the fifteenth P-type FET QP15 is coupled to the drain of the tenth N-type FET QN10, and the drain of the fifteenth P-type FET QP15 is coupled to the source of the tenth N-type FET QN10. The input terminal of the thirteenth inverter INV13 is coupled to the verifying comparison data SDi, and the output terminal of the thirteenth inverter INV13 is coupled to the gate of the fifteenth P-type FET QP15. With the above structure, the fourth switch 520 can be turned on or off according to the verifying comparison data SDi.

The second output circuit 540 is coupled to the second terminal of the fourth switch 520 and the second latch circuit 530. The second output circuit 540 includes a second NOR gate NOR2, a fourteenth inverter INV14, a second NAND gate NAND2, a third NOR gate NOR3, a sixteenth P-type FET QP16, an eleventh N-type FET QN11, a third NAND gate NAND3, a fourth NOR gate NOR4, a seventeenth P-type FET QP17 and a twelfth N-type FET QN12. The first input terminal of the second NOR gate NOR2 is coupled to the write amplifier enabling signal WE, and the second input terminal of the second NOR gate NOR2 is coupled to the verifying comparison data SDi. The input terminal of the fourteenth inverter INV14 is coupled to the output terminal of the second NOR gate NOR2. The first input terminal of the second NAND gate NAND2 is coupled to the second latch circuit 530, and the second input terminal of the second NAND gate NAND2 is coupled to the output terminal of the fourteenth inverter INV14. The first input terminal of the third NOR gate NOR3 is coupled to the second latch circuit 530, and the second input terminal of the third NOR gate NOR3 is coupled to the output terminal of the second NOR gate NOR2. The source of the sixteenth P-type FET QP16 is coupled to the operation voltage VDD, and the gate of the sixteenth P-type FET QP16 is coupled to the output terminal of the second NAND gate NAND2. The drain of the eleventh N-type FET QN11 is coupled to the drain of the sixteenth P-type FET QP16 and outputs the corresponding positive application data MDiT, the gate of the eleventh N-type FET QN11 is coupled to the output terminal of the third NOR gate NOR3, and the source of the eleventh N-type FET QN11 is coupled to the ground voltage GND. The first input terminal of the third NAND gate NAND3 is coupled to the output terminal of the second latch circuit 530, and the second input terminal of the third NAND gate NAND3 is coupled to the output terminal of the fourteenth inverter INV14. The first input terminal of the fourth NOR gate NOR4 is coupled to the second latch circuit 530, and the second input terminal of the fourth NOR gate NOR4 is coupled to the output terminal of the second NOR gate NOR2. The source of the seventeenth P-type FET QP17 is coupled to the operation voltage VDD, and the gate of the seventeenth P-type FET QP17 is coupled to the output terminal of the third NAND gate NAND3. The drain of the twelfth N-type FET QN12 is coupled to the drain of the seventeenth P-type FET QP17 and outputs the corresponding negative application data MDiN, the gate of the twelfth N-type FET QN12 is coupled to the output terminal of the fourth NOR gate NOR4, and the source of the twelfth N-type FET QN12 is coupled to the ground voltage GND. With the above structure, the second output circuit 540 can output the corrected application data MDi according to the write amplifier enabling signal WE, the corresponding verifying comparison data SDi, and the correction data SCDi.

Figure 6:
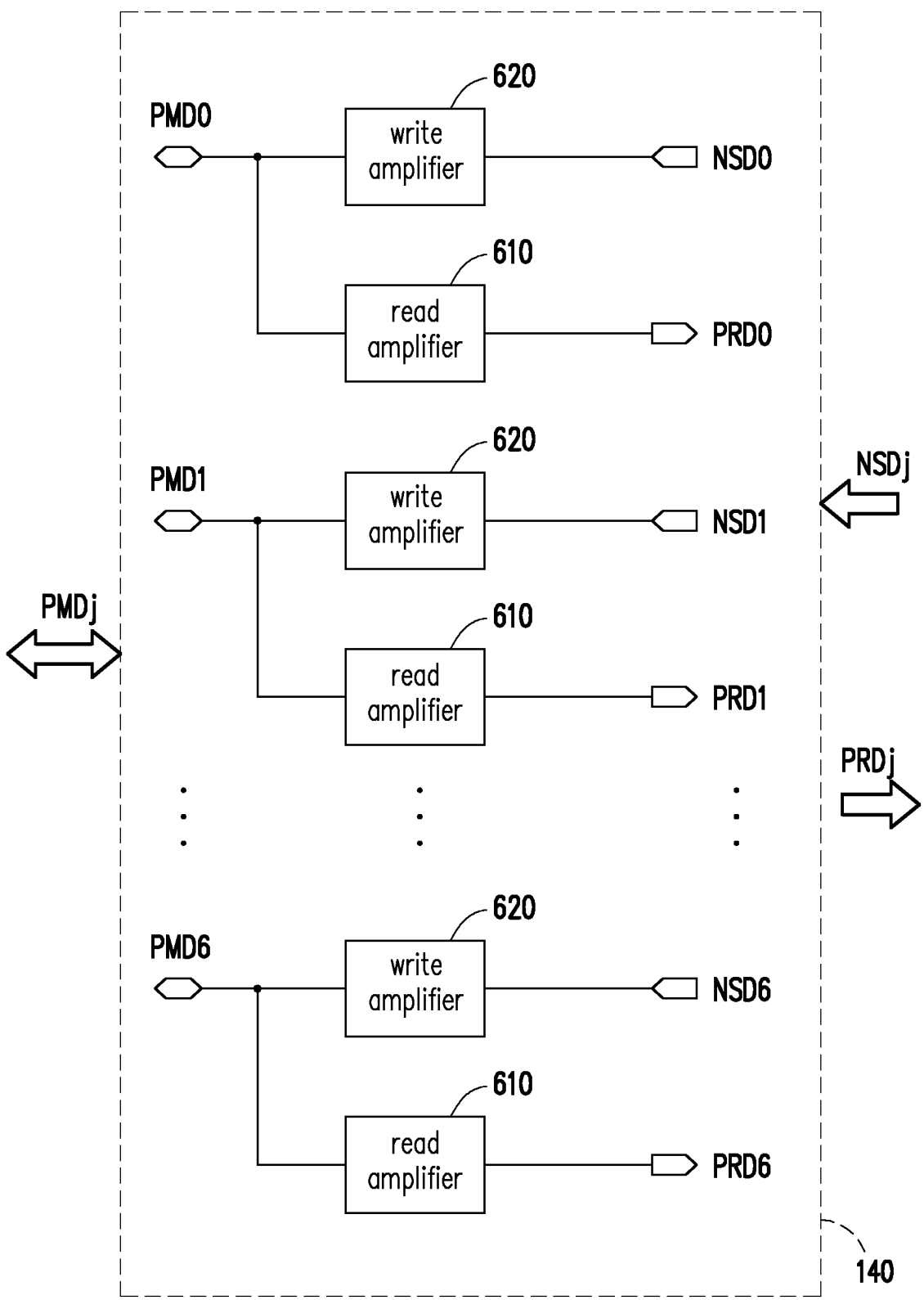
FIG. 6 is a schematic circuit diagram of a parity read/write part according to an embodiment of the disclosure.

FIG. 6 is a schematic circuit diagram of a parity read/write part according to an embodiment of the disclosure. The parity read/write part 140 of the embodiment of the present disclosure includes a plurality of read amplifiers 610 and a plurality of write amplifiers 620. The plurality of read amplifiers 610 read and amplify the parity data PMDj (PMD0 to PMD6) from the parity memory array 120 to generate the corresponding parity reading data PRDj (PRD0 to PRD6).

In FIG. 6, each of the write amplifiers 620 is coupled to the corresponding read amplifier 610. When the parity data PMDj (that is, the ECC code) needs to be updated, the write amplifiers 620 can write the parity data PMDj to the parity memory array 110 according to the syndrome writing data NSDj. In this manner, when the syndrome generating and decoding part 150 performs the syndrome operation, the updated parity data PMDj can be read by the plurality of read amplifiers 610. On this occasion, the syndrome writing data NSDj is substantially equal to the parity data PMDj. The detailed structure of the read amplifier 610 and the write amplifier 620 can be realized by related technologies of the existing memory reading circuit and the memory writing circuit, and the details thereof will not be described.

Figure 7:
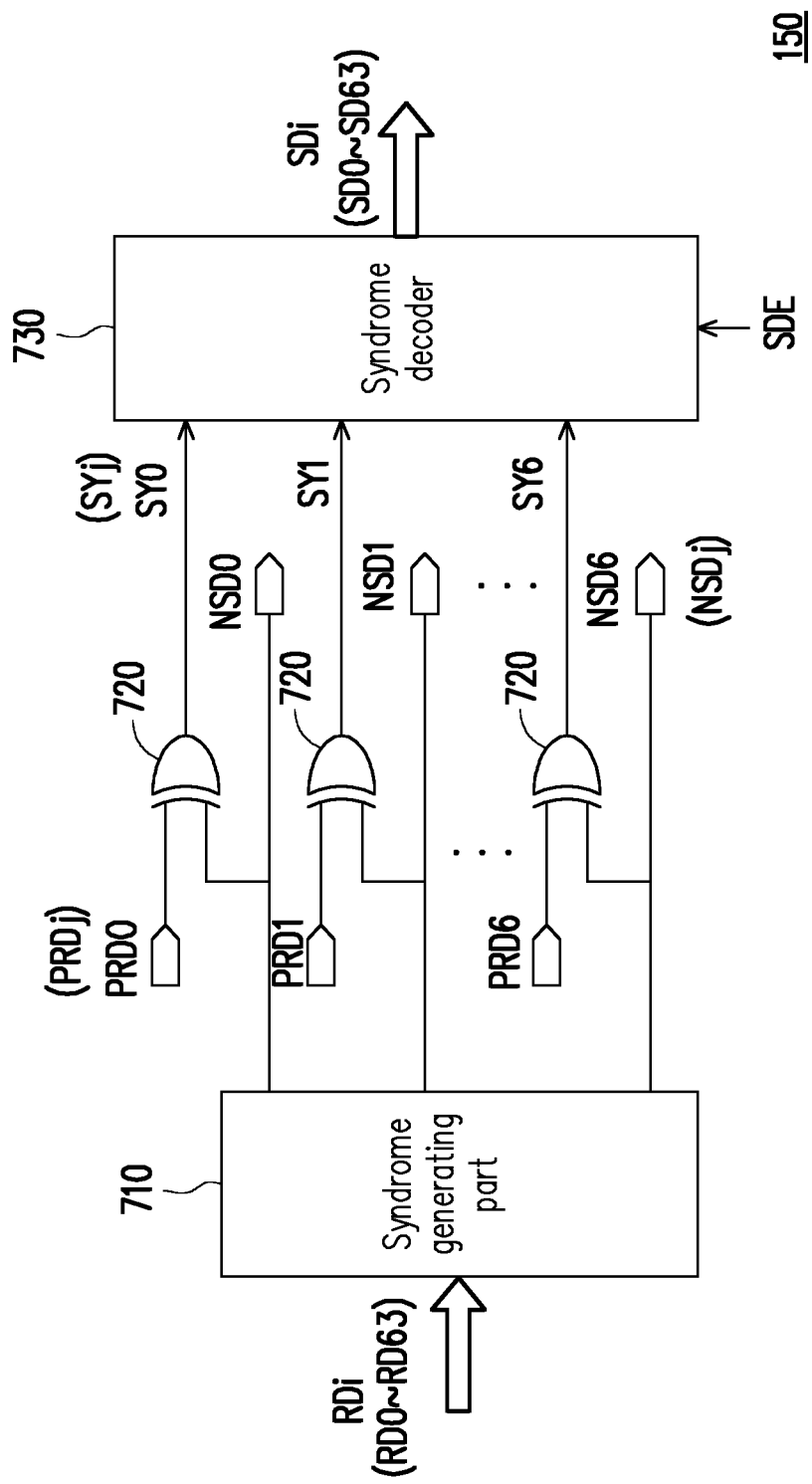
FIG. 7 is a schematic circuit diagram of a syndrome generating and decoding part according to an embodiment of the disclosure.

FIG. 7 is a schematic circuit diagram of a syndrome generating and decoding part according to an embodiment of the disclosure. Referring to FIG. 7, the syndrome generating and decoding part 150 includes a syndrome generator 710, a plurality of XOR gates 720, and a syndrome decoder 730. The syndrome generator 710 performs a syndrome operation by using the first application reading data RDi (RD0 to RD63) to generate a syndrome writing data NSDj (NSD0 to NSD6). The plurality of XOR gates 720 may perform the XOR operation on the corresponding syndrome writing data NSDj and the corresponding parity reading data PRDj respectively to generate a bit error signal SYj (SY0~SY6).

The syndrome decoder 730 is coupled to the plurality of XOR gates 720. The syndrome decoder 730 can decode the bit error signal SYj according to the verifying comparison enabling signal SDE to obtain the position of the error bit, and thereby generating the verifying comparison data SDi (SD0 to SD63). The detailed structure of the syndrome generator 710 and the syndrome decoder 730 can be implemented by the related technologies of the existing syndrome encoding and the syndrome decoding, and the details are not described herein.

In summary, when an error bit occurs in the read cycle of the data, the semiconductor memory apparatus of the present disclosure can instantly check the position of the error bit and correct it in the same read cycle, specifically directed to the error bit that is generated intermittently and randomly due to soft error, so it is possible to avoid accumulation of two bits or more. In this manner, the reliability of the data can be greatly improved for the memory apparatus using the single error correcting technique.

Although the present disclosure has been disclosed in the above embodiments, it is not intended to limit the present disclosure, and those skilled in the art can make some modifications and refinements without departing from the spirit and scope of the disclosure. Therefore, the scope to be protected by the present disclosure is subject to the scope defined by the appended claims.

What is claimed is:

1. A semiconductor memory apparatus, comprising:
a data memory array for storing an application data;
a parity memory array for storing a parity data corresponding to the application data;
a data read/write and correction part coupled to the data memory array for reading the application data of the data memory array, and outputting a corresponding first application reading data;
a parity read/write part coupled to the parity memory array for reading the parity data of the parity memory array, and outputting a corresponding parity reading data; and
a syndrome generating and decoding part coupled to the data read/write and correction part and the parity read/write part, wherein in a read cycle of the application data, the syndrome generating and decoding part generates a syndrome writing data according to the first application reading data, and compares and decodes the syndrome writing data and the parity reading data to generate a verifying comparison data,
wherein in the same read cycle, the data read/write and correction part corrects the application data according to the verifying comparison data, and writes the corrected application data back to the data memory array and outputs a corresponding output data,
wherein the data read/write and correction part comprises:
a plurality of read amplifiers, configured to read and amplify the application data from the data memory array to generate the corresponding first application reading data and a second application reading data;
a plurality of data correctors, coupled to the plurality of read amplifiers respectively, and configured to latch the second application reading data, correct an error bit in the second application reading data according to the verifying comparison data to generate the corresponding output data, and output a corresponding correction data; and
a plurality of write amplifiers, each of the plurality of write amplifiers coupled to a corresponding one of the read amplifiers and a corresponding one of the data correctors, the plurality of write amplifiers configured to write the corrected application data to the data memory array according to the corresponding correction data and the verifying comparison data.

2. The semiconductor memory apparatus of claim 1, wherein each of the plurality of read amplifiers comprises:

a first switch, having a first terminal coupled to the corresponding application data, a control terminal coupled to a read amplifier enabling signal, and configured to be turned on or off according to the read amplifier enabling signal;

a precharging circuit coupled to the first terminal of the first switch, receiving a precharging signal, and performing a precharging operation on the first terminal of the first switch according to the precharging signal; and an amplification circuit, having an input terminal coupled to a second terminal of the first switch, a control terminal coupled to the read amplifier enabling signal, and configured to output the corresponding first application reading data and the second application reading data from an output terminal of the amplification circuit according to the read amplifier enabling signal.

3. The semiconductor memory apparatus of claim 2, wherein the application data comprises a positive application data and a negative application data, and the first switch comprises:

a first N-type field effect transistor (FET), having a drain coupled to the positive application data;

a first P-type FET, having a source coupled to the drain of the first N-type FET, and a drain coupled to a source of the first N-type FET;

a second N-type FET, having a drain coupled to the negative application data;

a second P-type FET, having a source coupled to the drain of the second N-type FET, and a drain coupled to a source of the second N-type FET;

a first inverter, having an input terminal coupled to the read amplifier enabling signal, and an output terminal coupled to a gate of the first N-type FET and a gate of the second N-type FET; and a second inverter, having an input terminal coupled to the output terminal of the first inverter, and having an output terminal coupled to a gate of the first P-type FET and a gate of the second P-type FET.

4. The semiconductor memory apparatus of claim 3, wherein the precharging circuit comprises:

a third inverter, having an input terminal coupled to the precharging signal;

a third P-type FET, having a source coupled to an operation voltage, a gate coupled to an output terminal of the third inverter, and a drain coupled to the drain of the first N-type FET;

a fourth P-type FET, having a source coupled to the operation voltage, a gate coupled to an output terminal of the third inverter, and a drain coupled to the drain of the second N-type FET; and a fifth P-type FET, having a source coupled to the drain of the third P-type FET, a gate coupled to the gate of the fourth P-type FET, and a drain coupled to the drain of the fourth P-type FET.

5. The semiconductor memory apparatus of claim 3, wherein each of the plurality of second application reading data comprises a positive second application reading data and a negative second application reading data, and the amplification circuit comprises:

a sixth P-type FET, having a source coupled to an operation voltage, and having a drain coupled to the source of the first N-type FET;

a seventh P-type FET, having a source coupled to the operation voltage, and having a drain coupled to the source of the second N-type FET;

a third N-type FET, having a drain coupled to the drain of the sixth P-type FET and a gate of the seventh P-type FET, having a gate coupled to the drain of the seventh P-type FET, and configured to output the positive second application reading data;

a fourth N-type FET, having a drain coupled to the drain of the seventh P-type FET and a gate of the sixth P-type FET, having a gate coupled to the drain of the sixth P-type FET, and configured to output the negative second application reading data;

a fifth N-type FET, having a drain coupled to a source of the third N-type FET and a source of the fourth N-type FET, a gate coupled to the read amplifier enabling signal, and a source coupled to a ground voltage; and a fourth inverter, having an input terminal coupled to the drain of the fourth N-type FET, and an output terminal outputting the first application reading data.

6. The semiconductor memory apparatus of claim 1, wherein each of the plurality of data correctors comprises:

a second switch, having a first terminal coupled to the second application reading data, having a control terminal coupled to a read data latching signal, and configured to be turned on or off according to the read data latching signal;

a first latch circuit coupled to a second terminal of the second switch to latch the second application reading data;

a correction circuit coupled to the first latch circuit, configured to receive the verifying comparison data, and correct the second application reading data latched by the first latch circuit according to the verifying comparison data to output the corresponding correction data; and a first output circuit coupled to the correction circuit, configured to receive an output enabling signal, and output the corresponding output data according to the output enabling signal.

7. The semiconductor memory apparatus of claim 6, wherein each of the plurality of second application reading data comprises a positive second application reading data and a negative second application reading data, and the second switch comprises:

a sixth N-type FET, having a drain coupled to the positive second application reading data, and a gate coupled to the read data latching signal;

an eighth P-type FET, having a source coupled to the drain of the sixth N-type FET, and a drain coupled to a source of the sixth N-type FET;

a seventh N-type FET, having a drain coupled to the negative second application reading data, and a gate coupled to the read data latching signal;

a ninth P-type FET, having a source coupled to a drain of the seventh N-type FET, and a drain coupled to a source of the seventh N-type FET; and a fifth inverter, having an input terminal coupled to the read data latching signal, and an output terminal coupled to a gate of the eighth P-type FET and a gate of the ninth P-type FET.

8. The semiconductor memory apparatus of claim 7, wherein the correction circuit comprises:

a sixth inverter, having an input terminal coupled to the verifying comparison data;

a tenth P-type FET, having a source coupled to an operation voltage, and a gate coupled to an output terminal of the sixth inverter;

an eleventh P-type FET, having a source coupled to a drain of the tenth P-type FET, a gate coupled to the positive second application reading data, and a drain coupled to the first latch circuit;

a twelfth P-type FET, having a source coupled to the operation voltage, and a gate coupled to the output terminal of the sixth inverter;

a thirteenth P-type FET, having a source coupled to a drain of the twelfth P-type FET, a gate coupled to the negative second application reading data, and a drain coupled to the first latch circuit; and a seventh inverter, having an input terminal coupled to the first latch circuit, and an output terminal outputting the corresponding correction data.

9. The semiconductor memory apparatus of claim 8, wherein the first output circuit comprises:

an eighth inverter, having an input terminal coupled to the output enabling signal;

a first NAND gate, having a first input terminal coupled to the drain of the eleventh P-type FET, and a second input terminal coupled to the output enabling signal;

a first NOR gate, having a first input terminal coupled to the drain of the eleventh P-type FET, and a second input terminal coupled to an output terminal of the eighth inverter;

a fourteenth P-type FET, having a source coupled to the operation voltage, and a gate coupled to an output terminal of the first NAND gate;

an eighth N-type FET, having a drain coupled to a drain of the fourteenth P-type FET and outputting the corrected output data, a gate coupled to an output terminal of the first NOR gate, and a source coupled to a ground voltage;

a ninth inverter, having an input terminal coupled to the drain of the fourteenth P-type FET; and a tenth inverter, having an input terminal coupled to an output terminal of the ninth inverter, and an output terminal coupled to the input terminal of the ninth inverter.

10. The semiconductor memory apparatus of claim 1, wherein each of the plurality of write amplifiers comprises:

an eleventh inverter, having an input terminal coupled to the corresponding output data;

a third switch, having a first terminal coupled to an output terminal of the eleventh inverter, a control terminal coupled to a write data latching signal, and configured to be turned on or off according to the write data latching signal;

a fourth switch, having a first terminal coupled to the corresponding correction data, a control terminal coupled to the verifying comparison data, and configured to be turned on or off according to the verifying comparison data;

a second latch circuit coupled to a second terminal of the third switch and a second terminal of the fourth switch; and a second output circuit coupled to the second terminal of the fourth switch and the second latch circuit, and configured to receive a write amplifier enabling signal and the verifying comparison data, and output the corrected application data according to the write amplifier enabling signal, the verifying comparison data and the corresponding correction data.

11. The semiconductor memory apparatus of claim 10, wherein the third switch comprises:

a ninth N-type FET, having a drain coupled to the output terminal of the eleventh inverter, and a gate coupled to the write data latching signal;

a fourteenth P-type FET, having a source coupled to the drain of the ninth N-type FET, and a drain coupled to a source of the ninth N-type FET; and a twelfth inverter, having an input terminal coupled to the write data latching signal, and an output terminal coupled to a gate of the fourteenth P-type FET, wherein the fourth switch comprises:

a tenth N-type FET, having a drain coupled to the corresponding correction data, and a gate coupled to the verifying comparison data;

a fifteenth P-type FET, having a source coupled to the drain of the tenth N-type FET, and a drain coupled to a source of the tenth N-type FET; and a thirteenth inverter, having an input terminal coupled to the verifying comparison data, and an output terminal coupled to a gate of the fifteenth P-type FET.

12. The semiconductor memory apparatus of claim 11, wherein the application data comprises a positive application data and a negative application data, and the second output circuit comprises:

a second NOR gate, having a first input terminal coupled to the write amplifier enabling signal, and a second input terminal coupled to the verifying comparison data;

a fourteenth inverter, having an input terminal coupled to an output terminal of the second NOR gate;

a second NAND gate, having a first input terminal coupled to the second latch circuit, and a second input terminal coupled to an output terminal of the fourteenth inverter;

a third NOR gate, having a first input terminal coupled to the second latch circuit, and a second input terminal coupled to the output terminal of the second NOR gate;

a sixteenth P-type FET, having a source coupled to an operation voltage, and a gate coupled to an output terminal of the second NAND gate;

an eleventh N-type FET, having a drain coupled to a drain of the sixteenth P-type FET and outputting the corresponding positive application data, a gate coupled to an output terminal of the third NOR gate, and a source coupled to a ground voltage;

a third NAND gate, having a first input terminal coupled to the second latch circuit, and a second input terminal coupled to the output terminal of the fourteenth inverter;

a fourth NOR gate, having a first input terminal coupled to the second latch circuit, and a second input terminal coupled to the output terminal of the second NOR gate;

a seventeenth P-type FET, having a source coupled to the operation voltage, and a gate coupled to an output terminal of the third NAND gate; and a twelfth N-type FET, having a drain coupled to a drain of the seventeenth P-type FET and outputting the negative application data, a gate coupled to an output terminal of the fourth NOR gate, and a source coupled to the ground voltage.

13. The semiconductor memory apparatus of claim 1, wherein the parity read/write part comprises:

a plurality of read amplifiers, configured to read and amplify the parity data from the parity memory array to generate the corresponding parity reading data; and a plurality of write amplifiers, coupled to the plurality of read amplifiers respectively, and configured to write the parity data to the parity memory array according to the syndrome writing data.

14. The semiconductor memory apparatus of claim 1, wherein the syndrome generating and decoding part comprises:

a syndrome generator, configured to perform an arithmetic operation by using the first application reading data to generate the syndrome writing data;

a plurality of XOR gates, configured to perform an XOR operation on the syndrome writing data and the corresponding parity reading data respectively to generate a bit error data; and a syndrome decoder coupled to the plurality of XOR gates to decode the bit error data according to a verifying comparison enabling signal to obtain a position of the error bit, and thereby generating the verifying comparison data.

15. A method for reading a semiconductor memory apparatus including a data memory array and a parity memory array, the method comprising:

storing an application data in the data memory array;

storing a parity data corresponding to the application data in the parity memory array;

reading the application data, and outputting a corresponding first application reading data according to the read application data;

reading the parity data, and outputting a corresponding parity reading data according to the read parity data;

in a read cycle of the application data, generating a syndrome writing data according to the first application reading data, and generating a verifying comparison data by comparing and decoding the syndrome writing data and the parity reading data, and in the same read cycle of the application data, correcting the application data according to the verifying comparison data, and writing the corrected application data back to the data memory array and outputting a corresponding output data, wherein outputting the corresponding first application reading data comprises generating the corresponding first application reading data and a second application reading data by reading and amplifying the application data from the data memory array, correcting the application data according to the verifying comparison data comprises latching the second application reading data, correcting an error bit in the second application reading data according to the verifying comparison data to generate the corresponding output data, and outputting a corresponding correction data, and writing the corrected application data back to the data memory array comprises writing the corrected application data to the data memory array according to the corresponding correction data and the verifying comparison data.

16. The method of claim 15, further comprising:

writing the parity data to the parity memory array according to the syndrome writing data.

17. The method of claim 15, wherein generating the syndrome writing data and the verifying comparison data comprises:

performing an arithmetic operation by using the first application reading data to generate the syndrome writing data;

performing an XOR operation on the syndrome writing data and the corresponding parity reading data respectively to generate a bit error data; and decoding the bit error data according to a verifying comparison enabling signal to obtain a position of the error bit, and thereby generating the verifying comparison data.

* * * * *